(12) United States Patent
Benslimane et al.

(10) Patent No.: US 7,573,064 B2
(45) Date of Patent: Aug. 11, 2009

(54) DIELECTRIC ACTUATOR OR SENSOR STRUCTURE AND METHOD OF MAKING IT

(75) Inventors: Mohamed Yahia Benslimane, Nordborg (DK); Peter Gravesen, Nordborg (DK)

(73) Assignee: Danfoss A/S, Nordborg (DK)

( * ) Notice: Subject to any disclaimer, the term of this patent is extended or adjusted under 35 U.S.C. 154(b) by 220 days.

(21) Appl. No.: 10/499,429

(22) PCT Filed: Dec. 17, 2002

(86) PCT No.: PCT/DK02/00862

§ 371 (c)(1),
(2), (4) Date: Dec. 30, 2004

(87) PCT Pub. No.: WO03/056287

PCT Pub. Date: Jul. 10, 2003

(65) Prior Publication Data

US 2005/0104145 A1 May 19, 2005

(30) Foreign Application Priority Data

Dec. 21, 2001 (DK) .............................. 2001 01933

(51) Int. Cl.
*H01L 23/58* (2006.01)
(52) U.S. Cl. .................. 257/48; 257/306; 257/480; 257/486; 257/499; 257/E29.324
(58) Field of Classification Search .......... 257/306, 257/480, 486, 499, 48
See application file for complete search history.

(56) References Cited

U.S. PATENT DOCUMENTS

| | | | |
|---|---|---|---|
| 3,565,195 A | 2/1971 | Miller et al. | 177/210 |
| 3,753,294 A | 8/1973 | Attali et al. | 33/133 |
| 3,875,481 A | 4/1975 | Miller et al. | 317/246 |
| 4,266,263 A | 5/1981 | Haberl et al. | |

(Continued)

FOREIGN PATENT DOCUMENTS

DE  30 06 620 A  9/1981

(Continued)

OTHER PUBLICATIONS

Publication "High-field electrostriction of elastomeric polymer dielectrics for actuation" by Roy Kornbluh, et al., SRI International; SPIE vol. 3669, pp. 149-161; Mar. 1999.

(Continued)

*Primary Examiner*—Wai-Sing Louie
(74) *Attorney, Agent, or Firm*—McCormick, Paulding & Huber LLP

(57) ABSTRACT

The present invention relates to dielectric actuators or sensors of the kind wherein electrostatic attraction between two electrodes located on an elastomeric body leads to a compression of the body in a first direction and a corresponding extension of the body in a second direction. The dielectric actuator/sensor structure comprises a first sheet of elastomeric material having at least one smooth surface and a second surface and a second sheet of elastomeric material having at least one smooth surface and a second surface. The sheets are laminated together with their second surfaces exposed, and there is provided a first electrode on the second surface of the first sheet and second electrode on the second surface of the second sheet.

10 Claims, 1 Drawing Sheet

U.S. PATENT DOCUMENTS

| | | | |
|---|---|---|---|
| 4,330,730 A | 5/1982 | Kurz | |
| 4,370,697 A | 1/1983 | Haberl et al. | 361/283 |
| 4,376,302 A | 3/1983 | Miller | |
| 4,384,394 A | 5/1983 | Lemonon et al. | |
| 4,386,386 A | 5/1983 | Akita | 361/283 |
| 4,431,882 A | 2/1984 | Frame | 200/5 |
| 4,494,409 A | 1/1985 | Kondo et al. | 73/651 |
| 4,634,917 A | 1/1987 | Dvorsky et al. | 310/328 |
| 4,654,546 A | 3/1987 | Kirjavainen | 307/400 |
| 4,731,694 A | 3/1988 | Grabner et al. | 361/280 |
| 4,825,116 A | 4/1989 | Itoh et al. | |
| 4,829,812 A | 5/1989 | Parks et al. | |
| 4,836,033 A * | 6/1989 | Seitz | 73/862.046 |
| 4,852,443 A | 8/1989 | Duncan et al. | 84/1.04 |
| 4,866,412 A | 9/1989 | Rzepczynski | 338/114 |
| 4,879,698 A | 11/1989 | Langberg | |
| 4,986,136 A | 1/1991 | Brunner et al. | 73/862.04 |
| 5,060,527 A | 10/1991 | Burgess | 73/862.68 |
| 5,090,246 A | 2/1992 | Colla et al. | 73/718 |
| 5,090,248 A | 2/1992 | Cimmino et al. | 73/780 |
| 5,115,680 A | 5/1992 | Lew | 73/763 |
| 5,172,024 A | 12/1992 | Broussoux et al. | |
| 5,173,162 A | 12/1992 | Hagimura et al. | 204/299 |
| 5,255,972 A | 10/1993 | Shirasu | 60/528 |
| 5,259,099 A | 11/1993 | Banno et al. | |
| 5,321,332 A | 6/1994 | Toda | |
| 5,410,210 A | 4/1995 | Sato et al. | 310/363 |
| 5,425,275 A | 6/1995 | Lockshaw | 73/775 |
| 5,447,076 A | 9/1995 | Ziegler | 73/862.626 |
| 5,449,002 A | 9/1995 | Goldman | 128/779 |
| 5,528,452 A | 6/1996 | Ko | 361/283.4 |
| 5,548,564 A | 8/1996 | Smith | 367/140 |
| 5,642,015 A | 6/1997 | Whitehead et al. | |
| 5,755,090 A | 5/1998 | Hu | 60/39.091 |
| 5,755,909 A | 5/1998 | Gailus | 156/229 |
| 5,841,143 A * | 11/1998 | Tuma et al. | 250/458.1 |
| 5,977,685 A | 11/1999 | Kurita et al. | 310/311 |
| RE37,065 E * | 2/2001 | Grahn | 73/628 |
| 6,210,514 B1 | 4/2001 | Cheung et al. | 156/241 |
| 6,282,956 B1 | 9/2001 | Okada | 73/504.12 |
| 6,343,129 B1 | 1/2002 | Pelrine et al. | 381/191 |
| 6,376,971 B1 | 4/2002 | Pelrine et al. | 310/363 |
| 6,437,489 B1 | 8/2002 | Shinke et al. | |
| 6,543,110 B1 | 4/2003 | Pelrine et al. | 29/25.35 |
| 6,545,384 B1 | 4/2003 | Pelrine et al. | 310/309 |
| 6,545,395 B2 | 4/2003 | Matsui et al. | |
| 6,581,481 B1 | 6/2003 | Perusek | 73/862.337 |
| 6,583,533 B2 | 6/2003 | Pelrine et al. | 310/309 |
| 6,586,859 B2 | 7/2003 | Kornbluh et al. | 310/309 |
| 6,628,040 B2 | 9/2003 | Pelrine et al. | 310/307 |
| 6,662,658 B2 | 12/2003 | Foote | 73/514.29 |
| 6,664,718 B2 | 12/2003 | Pelrine et al. | 310/800 |
| 6,707,236 B2 | 3/2004 | Pelrine et al. | 310/800 |
| 6,768,246 B2 | 7/2004 | Pelrine et al. | 310/339 |
| 6,781,284 B1 | 8/2004 | Pelrine et al. | 310/330 |
| 6,806,621 B2 | 10/2004 | Heim et al. | 310/328 |
| 6,809,462 B2 | 10/2004 | Pelrine et al. | 310/800 |
| 6,812,624 B1 | 11/2004 | Pei et al. | 310/800 |
| 6,876,135 B2 | 4/2005 | Pelrine et al. | 310/339 |
| 6,882,086 B2 | 4/2005 | Kornbluh et al. | 310/328 |
| 6,891,317 B2 | 5/2005 | Pei et al. | 310/800 |
| 6,911,764 B2 | 6/2005 | Pelrine et al. | 310/328 |
| 6,940,211 B2 | 9/2005 | Pelrine et al. | 310/330 |
| 7,034,432 B1 | 4/2006 | Pelrine et al. | 310/309 |
| 7,049,732 B2 | 5/2006 | Pei et al. | 310/800 |
| 7,064,472 B2 | 6/2006 | Pelrine et al. | 310/324 |
| 7,104,146 B2 | 9/2006 | Benslimane | 73/862.626 |
| 7,211,937 B2 | 5/2007 | Kornbluh et al. | |
| 2001/0026165 A1 | 10/2001 | Pelrine et al. | 324/750 |
| 2001/0035723 A1 | 11/2001 | Pelrine et al. | 318/116 |
| 2002/0008445 A1 | 1/2002 | Pelrine et al. | 310/330 |
| 2002/0050768 A1 | 5/2002 | Beck et al. | 310/334 |
| 2002/0130673 A1 | 9/2002 | Pelrine et al. | 324/727 |
| 2002/0175594 A1 | 11/2002 | Kornbluh et al. | 310/317 |
| 2002/0175598 A1 | 11/2002 | Heim et al. | 310/328 |
| 2002/0185937 A1 | 12/2002 | Heim et al. | 310/339 |
| 2003/0006669 A1 | 1/2003 | Pei et al. | 310/309 |
| 2003/0066741 A1 | 4/2003 | Burgess et al. | 200/61.43 |
| 2003/0067245 A1 | 4/2003 | Pelrine et al. | 310/311 |
| 2003/0125781 A1 | 7/2003 | Dohno et al. | |
| 2003/0141473 A1 | 7/2003 | Pelrine et al. | 251/129.06 |
| 2003/0141787 A1 | 7/2003 | Pelrine et al. | 310/365 |
| 2003/0213960 A1 * | 11/2003 | Kitagawa et al. | 257/71 |
| 2003/0214199 A1 | 11/2003 | Heim et al. | 310/309 |
| 2004/0008853 A1 | 1/2004 | Pelrine et al. | 381/191 |
| 2004/0012301 A1 | 1/2004 | Benslimane et al. | 310/311 |
| 2004/0124738 A1 | 7/2004 | Pelrine et al. | 310/307 |
| 2004/0217671 A1 | 11/2004 | Rosenthal et al. | 310/328 |
| 2004/0232807 A1 | 11/2004 | Pelrine et al. | 310/800 |
| 2004/0263028 A1 | 12/2004 | Pei et al. | 310/800 |
| 2005/0040736 A1 | 2/2005 | Topliss et al. | |
| 2005/0157893 A1 | 7/2005 | Pelrine et al. | 381/190 |
| 2006/0016275 A1 | 1/2006 | Gravesen et al. | |
| 2006/0066183 A1 | 3/2006 | Benslimane et al. | 310/369 |
| 2006/0113878 A1 | 6/2006 | Pei et al. | 310/363 |
| 2006/0113880 A1 | 6/2006 | Pei et al. | 310/800 |
| 2006/0119225 A1 | 6/2006 | Heim et al. | 310/339 |
| 2006/0158065 A1 | 7/2006 | Pelrine et al. | 310/328 |
| 2007/0269585 A1 | 11/2007 | Benslimane et al. | |
| 2007/0277356 A1 | 12/2007 | Benslimane et al. | |

FOREIGN PATENT DOCUMENTS

| | | |
|---|---|---|
| DE | 3006620 A | 9/1981 |
| DE | 30 23 218 A | 2/1982 |
| DE | 3023218 A | 2/1982 |
| DE | 38 41 243 A1 | 6/1990 |
| DE | 198 26 391 A | 12/1999 |
| DE | 19826391 A1 | 12/1999 |
| DE | 100 54 247 A1 | 5/2000 |
| DE | 200 04 248 U1 | 8/2000 |
| EP | 0 387 180 A1 | 9/1990 |
| EP | 0 855 307 A2 | 1/1998 |
| EP | 0 855 307 | 7/1998 |
| EP | 148 1738 A2 | 12/2004 |
| FR | 2 309 833 | 12/1976 |
| FR | 2793937 A1 | 11/2000 |
| JP | 55-42474 | 3/1980 |
| JP | 55-91299 | 7/1980 |
| JP | 1-273372 | 11/1989 |
| JP | 2002-237625 A | 8/2003 |
| KR | 90-1465 | 3/1990 |
| WO | WO 96/34701 | 11/1996 |
| WO | WO 97/27822 | 8/1997 |
| WO | WO 00/66970 | 11/2000 |
| WO | WO 01/06575 A1 | 1/2001 |
| WO | WO 01/06579 A2 | 1/2001 |
| WO | WO 01/58973 A2 | 8/2001 |
| WO | WO 01/59852 A3 | 8/2001 |
| WO | WO 01/63738 A2 | 8/2001 |
| WO | WO 01/65615 A3 | 9/2001 |
| WO | 02/37660 A1 | 5/2002 |
| WO | WO 2004/079832 A2 | 9/2004 |
| WO | WO 2005/079187 A2 | 9/2005 |
| WO | WO 2005/081676 A2 | 9/2005 |

OTHER PUBLICATIONS

Publication "Micro-Electro-Mechanical Systems (MEMS)—2000" by R. Trujillo, et al.; Presented at 2000 ASME International Mechanical Engineering Congress and Exposition, Nov. 5-10, 2000; Orlando, FL; pp. 709-716.

Article entitled "Spontaneous formation of ordered structures in thin films of metals supported on an elastomeric polymer" by N. Bowden, et al., Nature, vol. 393 dated May 14, 1998; pp. 146-149.

Article "Silicone Elastomers with Controlled Surface Composition Using Argon or Hydrogen Plasma Treatment" by B. Olander, et al., Journal of Applied Polymer Science, vol. 90, 2003 Wiley Periodicals, Inc.; pp. 1378-1383.

PCT Search Report for Serial No. PCT/DK03/00848 dated Mar. 25, 2004.

Article entitled "Electrostrictive Polymer Artificial Muscle Actuators" by R. Kornbluh, et al. Proceedings, 1998 IEEE International Conference on Robotics and Automation (Cat. No. 98CH36146), IEEE International Conference on Robotics and Automation, Leuven, Belgium, May 16-20, 1998; pp. 2147-2154, vol. 3, XP002269205, 1998.

International Search Report for PCT Serial No. PCT/DK03/00603 dated Feb. 5, 2004.

* cited by examiner

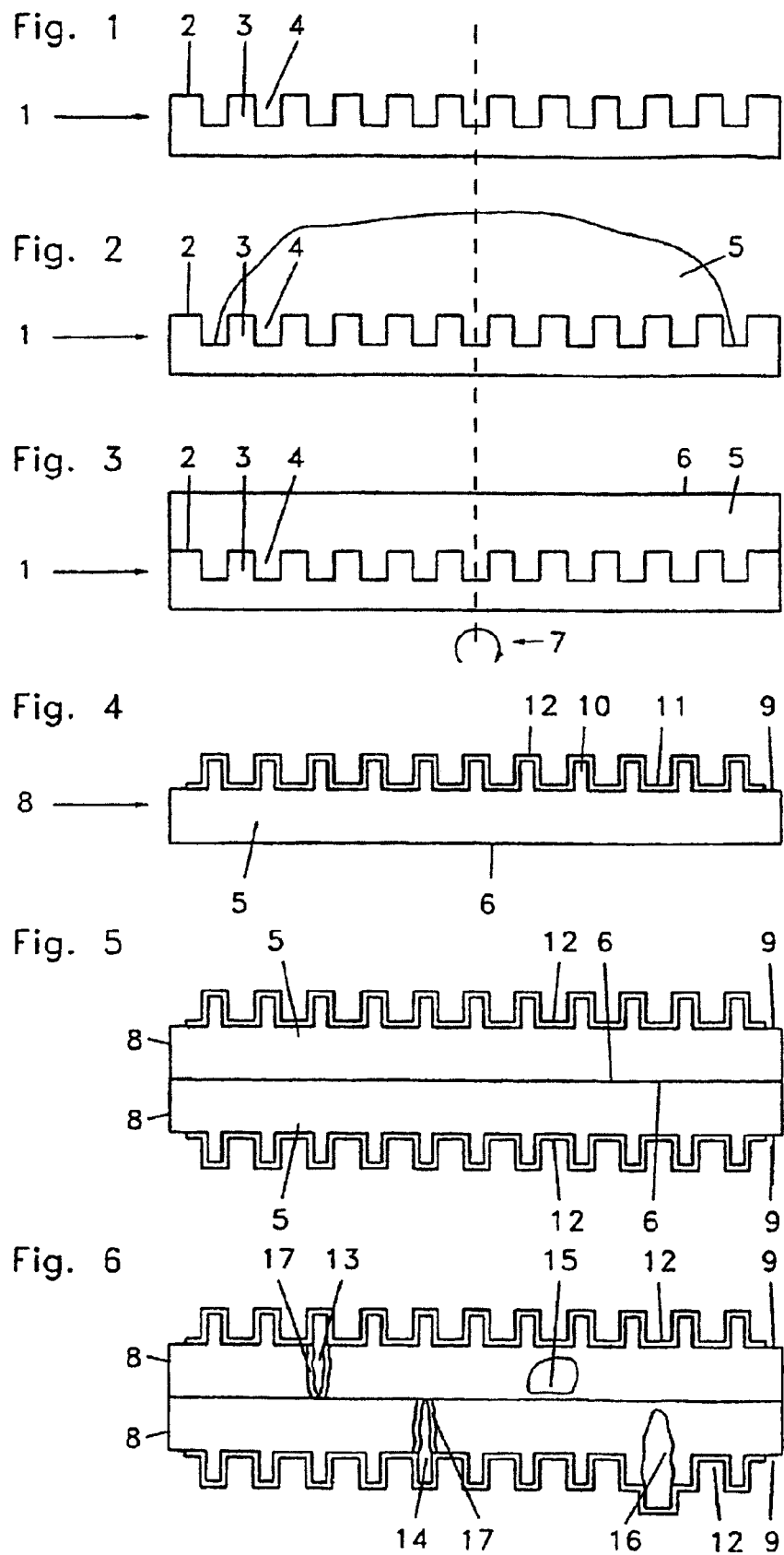

DIELECTRIC ACTUATOR OR SENSOR STRUCTURE AND METHOD OF MAKING IT

CROSS-REFERENCE TO RELATED APPLICATIONS

This application is entitled to the benefit of and incorporates by reference essential subject matter disclosed in International Application No. PCT/DK02/00862 filed on Dec. 17, 2002 and Danish Patent Application No. PA 2001 01933 filed on Dec. 21, 2001.

FIELD OF THE INVENTION

The present invention relates to dielectric actuators of the kind wherein electrostatic attraction between two electrodes located on an elastomeric body leads to a compression of the body in a first direction and a corresponding extension of the body in a second direction.

BACKGROUND OF THE INVENTION

Such actuators may be employed as force sensors by operating the electrodes as the plates of a capacitor. In this mode of operation, compression of the elastomeric body by an external force will reduce the distance between the electrodes, causing an increase in capacitance of the electrode capacitor which can be measured to indicate the magnitude of the force.

It is an object of the invention to provide a dielectric actuator/sensor structure which is easy to produce and tolerant of production defects such as pinholes, cracks and inclusions in the body thereof. It is a further object of the invention to provide a method of making a dielectric actuator/sensor structure which provides a high yield while having advantages of simplicity and economy.

SUMMARY OF THE INVENTION

In accordance with one aspect of the invention, a dielectric actuator/sensor structure comprises a first sheet of elastomeric material having at least one smooth surface and a second surface and a second sheet of elastomeric material having at least one smooth surface and a second surface. The sheets are laminated together with their second surfaces exposed, and there is provided a first electrode on the second surface of the first sheet and a second electrode on the second surface of the second sheet.

In accordance with another aspect of the invention, a method of making a dielectric actuator/sensor structure comprises the steps of: a) providing a generally planar mould, b) casting a layer of elastomeric material in the mould, c) causing the layer to have a smooth surface and a second surface, d) curing the layer, and e) removing the layer from the mould to provide an elastomeric sheet having a smooth surface and a second surface. These steps are repeated in a step e) to provide a second elastomeric sheet having a smooth surface and a second surface. Electrodes are made on the sheets in a step f) of depositing at least one electrically conductive layer on the second surface of each elastomeric sheet. The sheets are assembled into a finished actuator/sensor structure by g) laminating the elastomeric sheets together with their second surfaces exposed.

The laminated structure is a key factor in achieving production "robustness". Consider, for example, the existence of minor defects such as pinholes, cracks or inclusions in each sheet. Even if cleanliness is observed in producing the sheets, a significant number of such defects may exist, even though it is only a minor number. In a single-sheet dielectric actuator/sensor, such defects may reduce the breakdown voltage between the electrodes by as much as 95% or even cause direct shorting of the electrodes.

Laminating two sheets together to form the final structure substantially eliminates this problem. As a starting point it can typically be assured by proper control of production that only a minor number of defects will exist and be spread randomly across each sheet. This in turn makes it very unlikely that two defects will be co-located in the assembled structure. Therefore, even if one layer of the assembled structure has a defect in a certain location, the other layer of the structure will most likely be defect-free in the same location. As a consequence, the probability of direct shorts is for all practical considerations reduced to zero, and the reduction of breakdown voltage from inclusions is limited to 50% at most.

BRIEF DESCRIPTION OF THE DRAWINGS

Preferred embodiments of the invention will now be described with reference to the accompanying drawings.

FIG. 1 shows a generally planar mould having a micro-corrugated surface.

FIG. 2 shows a volume of curable elastomeric material poured on the mould.

FIG. 3 shows the effect of spinning the mould to smoothen the free surface of the elastomeric material.

FIG. 4 shows the elastomeric material removed from the mould as a sheet and provided with an electrode on its corrugated surface.

FIG. 5 shows two sheets laminated together to form a dielectric actuator/sensor structure.

FIG. 6 illustrates the passivation of defects such as pinholes and inclusions by virtue of the laminated construction of the dielectric actuator/sensor structure.

DETAILED DESCRIPTION OF THE PREFERRED EMBODIMENTS

The generally planar mould 1 in FIG. 1 has a micro-corrugated surface 2 with ridges 3 and grooves 4. The ridges and grooves run in parallel along a direction which is transverse to the plane of the paper. The peak-to-peak amplitude of the corrugations 3, 4 is typically between 1 and 10 micrometers whereas the overall size of the mould is in the range of 5-10 centimeters across the corrugated surface or more. It is obvious that the drawing is not to scale and that the corrugations have been exaggerated for illustration. The mould may be manufactured from any suitable material such as metal or silicon, and the corrugation may be produced by conventional photolithographic or holographic processes.

In FIG. 2, a volume of curable elastomeric material 5 has been poured on the mould 1. The material may be a silicone rubber, for example.

In FIG. 3, the elastomeric material 5 has been shaped into a sheet-like layer having a smooth upper surface 6, by spinning the mould as indicated at 7. Such spinning processes are well-known in the art of photolithography. An alternative way of causing the formation of a smooth upper surface 6 on the elastomeric layer 5 would be by pressing it into shape with a smooth die. After spinning or press-shaping, the elastomeric layer 5 is cured, which may just involve letting it sit on the mould for a certain amount of time, depending on the characteristics of the material.

FIG. 4 shows the elastomeric layer 5 removed from the mould to form a sheet 8 and turned upside down. Removing the sheet from the mould has exposed its second surface 9, which is patterned with corrugations 10 and 11 as the surface of the mould. An electrode 12 has been deposited on the surface 9. This may be done by vapor deposition of a metal such as silver, or by electrolytic techniques, for example.

The sheet 8 typically has a thickness of about 10-50 micrometers and the electrodes have a thickness of about 20-100 nanometers.

FIG. 5 shows a dielectric actuator/sensor structure assembled from two sheets 9 of the kind made and structured as just described. The sheets are laminated together with their smooth surfaces 6 touching each other and their second surfaces 9 exposed. Lamination is preferably done under vacuum to prevent the inclusion of gas bubbles between the sheets.

The corrugation of the exposed surfaces makes the laminated assembly highly anisotropic in its elastic behaviour. To this end, it is preferred to laminate the sheets together with the corrugations of both sheets running in parallel. In operation, a high voltage is applied between the electrodes on the corrugated surfaces. Electrostatic attraction between the electrodes will then tend to compress the structure. Facilitated by the corrugations, this compression will cause the structure to extend in length as its volume will tend to remain constant. Substantially no transverse change of dimensions (transverse to the paper plane) will occur because of the presence of the metallic electrodes on the anisotropic corrugations.

FIG. 6 illustrates the beneficial effects of the laminated structure with respect to defects and inclusions. Each sheet is shown with a pinhole 13, 14 and an inclusion 15, 16 of a metallic object. In a single-layer structure, the presence of pinholes 13 or 14 would cause a short between the electrodes 12 because electrode deposition runs down into the pinholes as shown at 17. Metallic inclusions 15, 16 reduce the remaining thickness of the elastomeric material 5, which serves as an insulator between the electrodes 12. In a single-layer structure, this may reduce the breakdown voltage between the electrodes severely.

In the laminated structure of FIG. 6, however, there is still a defect-free single layer of elastomeric material between the electrodes 12 at each defect 13, 14, 15, 16. This reduces the occurrence of shorts substantially to zero, and limits the reduction of breakdown voltage to 50% at most. Of course, there is nothing to prevent the accidental co-location of two defects, but with proper cleanliness applied to production generally, the risk of this occuring will be very low indeed and much lower than the risk of defects in a single-layer structure.

It deserves to be mentioned that the laminated construction may be equally beneficially applied to dielectric actuator/sensor structures having patterned electrodes on smooth exposed surfaces to facilitate longitudinal extension, instead of solid electrodes on corrugated exposed surfaces.

What is claimed is:

1. A dielectric actuator/sensor structure comprising:
    A first sheet of elastomeric material having at least one smooth surface and a second surface;
    A second sheet of elastomeric material having at least one smooth surface and a second surface;
    The sheets being laminated together with their second surfaces exposed;
    A first electrode being deposited on the second surface of the first sheet; and
    A second electrode being deposited on the second surface of the second sheet; wherein the first and second sheets are formed of the same elastomeric material; and wherein at least one of the second surfaces is corrugated.

2. a dielectric actuator/sensor structure as in claim 1, wherein both of the second surfaces are corrugated.

3. The dielectric actuator/sensor structure according to claim 1, wherein at least one of the first and second electrode consists essentially of a deposit of metal, such as silver, which has been deposited by vapor deposition or by an electrolytic process.

4. The dielectric actuator/sensor structure according to claim 1, wherein at least one of the first and second sheet of elastomeric material consists essentially of silicone rubber.

5. The dielectric actuator/sensor structure according to claim 2, wherein the peak-to-peak amplitude of the corrugations is between 1 and 10 micrometers.

6. The dielectric actuator/sensor structure according to claim 1, wherein the electrodes have a thickness of about 20-100 nanometers.

7. A dielectric actuator/sensor structure comprising:
    a first sheet of elastomeric material having at least one smooth surface and a second surface;
    a second sheet of elastomeric material having at least one smooth surface and a second surface;
    the sheets being laminated together with their second surfaces exposed;
    a first electrode being deposited on the second surface of the first sheet; and
    a second electrode being deposited on the second surface of the second sheet;
    wherein the first sheet with its respective first electrode is substantially identical to the second sheet with its respective second electrode.

8. The dielectric actuator/sensor structure according to claim 1, wherein the second surfaces are substantially covered by the deposited first and second electrodes.

9. The dielectric actuator/sensor structure according to claim 2, wherein the corrugated second surfaces are disposed such that the corrugations are substantially aligned.

10. A dielectric actuator/sensor structure comprising:
    a first sheet of elastomeric material having at least one smooth surface and a second surface;
    a second sheet of elastomeric material having at least one smooth surface and a second surface;
    the sheets being laminated together with their second surfaces exposed;
    a first electrode being deposited on the second surface of the first sheet; and
    a second electrode being deposited on the second surface of the second sheet;
    wherein the second surfaces, and the deposited first and second electrodes, are corrugated.

* * * * *